(12) United States Patent
Lampe

(10) Patent No.: US 9,784,793 B2
(45) Date of Patent: Oct. 10, 2017

(54) DYNAMO-ELECTRIC MACHINE WITH INSULATION MONITORING

(71) Applicant: Siemens Aktiengesellschaft, München (DE)

(72) Inventor: Robert Lampe, Dietenhofen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 49 days.

(21) Appl. No.: 14/816,806

(22) Filed: Aug. 3, 2015

(65) Prior Publication Data

US 2016/0033579 A1  Feb. 4, 2016

(30) Foreign Application Priority Data

Aug. 4, 2014  (EP) .................................. 14179653

(51) Int. Cl.
*G01N 27/00* (2006.01)
*G01R 31/34* (2006.01)
*H02K 11/00* (2016.01)
*G01R 31/12* (2006.01)
*H02K 3/38* (2006.01)
*H02K 11/20* (2016.01)

(52) U.S. Cl.
CPC ............ *G01R 31/34* (2013.01); *G01R 31/12* (2013.01); *H02K 3/38* (2013.01); *H02K 11/001* (2013.01); *H02K 11/20* (2016.01); *H02K 2213/06* (2013.01)

(58) Field of Classification Search
CPC .. G01R 31/1227; G01R 31/025; G01R 31/34; G01R 33/3806; G01R 31/346; G01R 31/008; G01R 31/027; G01R 15/183; G01R 27/18; G01R 31/12; G01R 31/1245; G01R 31/1272; G01R 31/40; G01R 27/2605; G01R 31/024; G01R 33/02; G01R 33/34092; G01R 33/3856; G01R 35/00; G01R 29/24; H02K 11/20; H02K 11/001; H02K 11/35; H02K 2213/06; H02K 3/38; H02K 9/24; H02P 29/02

See application file for complete search history.

(56) References Cited

U.S. PATENT DOCUMENTS

| 4,814,699 | A | * | 3/1989 | Koziel | G01R 31/343 324/511 |
| 4,940,933 | A | * | 7/1990 | Jenkins | G01R 31/1218 324/765.01 |
| 6,218,757 | B1 | * | 4/2001 | Ong | H02K 11/01 310/223 |
| 2007/0194631 | A1 | | 8/2007 | Horiuchi et al. | |
| 2013/0033214 | A1 | * | 2/2013 | Obata | G01R 31/1227 318/490 |

FOREIGN PATENT DOCUMENTS

| JP | S55 122450 A | 9/1980 |
| JP | H02 184204 A | 7/1990 |
| WO | WO 2014-114673 A2 | 7/2014 |

* cited by examiner

*Primary Examiner* — Vinh Nguyen
(74) *Attorney, Agent, or Firm* — Henry M. Feiereisen LLC

(57) ABSTRACT

An air-cooled dynamo-electric machine, in particular an enclosed-ventilated dynamo-electric machine includes a stator with a winding system which forms end windings at the end faces of the stator. At least the end winding has at least one monitoring element in its insulation layer, or in an additional layer which is applied to this insulation layer, for the purpose of monitoring the insulation thickness of the end winding.

6 Claims, 4 Drawing Sheets

DYNAMO-ELECTRIC MACHINE WITH INSULATION MONITORING

CROSS-REFERENCES TO RELATED APPLICATIONS

This application claims the priority of European Patent Application, Serial No. 14179653, filed Aug. 4, 2014, pursuant to 35 U.S.C. 119(a)-(d), the disclosure of which is incorporated herein by reference in its entirety as if fully set forth herein.

BACKGROUND OF THE INVENTION

The present invention relates to an air-cooled dynamo-electric machine, in particular an enclosed-ventilated dynamo-electric rotary machine.

The following discussion of related art is provided to assist the reader in understanding the advantages of the invention, and is not to be construed as an admission that this related art is prior art to this invention.

An air-cooled dynamo-electric rotary machine for example typically includes a stator which has axially layered plates to form a laminated core having slots which run essentially axially. The slots are arranged in the region of the air gap of the dynamo-electric rotary machine, and receive a winding system which forms end windings at an end face of the stator. In particular the end windings of air-cooled dynamo-electric machines, extending axially at the end faces of a stator, are arranged in the region of air flows and are therefore exposed to a particle stream which is included in this air stream. The end winding in particular is hereby exposed to a bombardment of air particles and dust particles which result in abrasion of the insulation of the end winding and can therefore impair the operation of the dynamo-electric machine.

It would therefore be desirable and advantageous to address this prior art problem and to enable an effective way to monitor an insulation of the winding system, in particular an insulation of the end winding of a dynamo-electric machine.

SUMMARY OF THE INVENTION

According to one aspect of the present invention, an air-cooled dynamo-electric machine includes a stator having a winding system which forms end windings at end faces of the stator, and at least one monitoring element provided in an insulation layer or in an additional layer applied to the insulation layer of at least each end winding for monitoring an insulation thickness of the end winding.

According to an another aspect of the present invention, a method for checking an insulation state of an end winding of an air-cooled dynamo-electric machine includes sending signals to a monitoring element in an end winding of a winding system at an end face of a stator at predetermined time intervals, receiving return signals from the monitoring element, and evaluating the return signals to draw a conclusion about the insulation state of the end winding.

In accordance with the present invention, the monitoring system is able to report ahead of time a failure of the insulation, i.e. of the insulation system at particularly sensitive points, which are exposed to a particle stream as a result of the air cooling. In particular, the insulation at the end winding of the dynamo-electric machine is monitored before the machine fails and losses are sustained accordingly.

Of course, the winding system of the dynamo-electric machine can also be monitored in the slots in the manner according to the invention.

According to another advantageous feature of the present invention, the monitoring element can be provided in the end winding at least at an area which is exposed to a cooling air stream. In other words, the monitoring system can be advantageously provided in insulation layers at particularly sensitive points of the end winding, at which e.g. the cooling air stream first strikes elements of the dynamo-electric machine, or where an internal distribution of the cooling air stream results to a greater extent in a particle stream at certain parts of the winding system, the end winding in this case.

It is therefore not necessarily essential to equip the whole end winding with a monitoring element, but only to monitor, depending on the machine design, certain points at the end winding or certain surface areas at the end winding, which prove to be particularly critical due to the machine design, because of their increased exposure to the particle stream.

According to another advantageous feature of the present invention, the monitoring element can be embodied as a wire or optical fiber arrangement, with one or more conductors being provided within the insulation system and/or in a special intermediate layer at the end winding, and therefore likewise exposed to the particle stream of the air flow. The insulation of the wires or optical fibers is therefore likewise exposed to the abrasion, and is inevitably likewise stressed by the particle stream in this way, i.e. broken or severed in extreme cases.

As a result, the ohmic resistance of the wires changes or the refractive index of the optical fiber changes.

These wires or optical fibers can be installed in series or in parallel in this case. These wires or optical fibers can also be installed in a meandering form in the desired monitoring region of the end winding.

This change, in the worst case a severing of the wire or optical fiber, is then captured metrologically and can be rated as an indicator of increased insulation stress or wear to the insulation of the end winding.

According to another advantageous feature of the present invention, the monitoring element can be embedded in the insulation of the end winding or in an intermediate layer of the end winding using a plurality of radially superimposed wires or optical fibers starting from the end winding. A progressive safety model for the insulation monitoring is therefore provided, with correspondingly incremental reports allowing time management of the further operation of the electric machine.

Using a progressive model, for example, it might therefore be detected that the first level reacts after approximately two years, the second level after a further two years, and applying a linear projection and given similar operating conditions, it can then be assumed that when three layers are provided, for example, the insulation of the end winding is vulnerable at this stage, and maintenance and reworking are required to the insulation of the end winding of the dynamo-electric machine.

A layer thickness measurement of the electric insulation of the winding system is therefore performed in the manner according to the invention, in particular at areas of the end winding which are particularly exposed.

A traffic-light status, warning tones or other optical and/or acoustic signals may therefore be established in relation to the monitoring of the insulation state of the end winding of the dynamo-electric machine.

The monitoring can take place in a plurality of different ways. Firstly, the wires or optical fibers can be routed outside the motor housing, so that they can be checked for continuity there by service personnel, for example. This can be effected by simple resistance measurement, for example. In the case of an optical fiber arrangement, a light measuring device can be used to check the insulation resistance at the end winding.

In a further, automated approach to monitoring, a corresponding measurement signal can be applied to the wire or to the optical fiber at predetermined time intervals by a control module, which may be situated in the converter or directly at the electric machine, for example. On the basis of the return signal, corresponding measurement values or reports are then stored in a memory, for example, where they can be retrieved at any time.

According to another advantageous feature of the present invention, the measurement data can be forwarded to a control point, where it is classified and evaluated.

These reports of the insulation resistance, in particular at the end winding, can be transmitted via wire or wirelessly, e.g. via radio, to all supervisory system control units in the case of e.g. trainsets or mining trucks in order thus to provide reports, e.g. for the driver and/or a control point, about the state of the insulation system and therefore the drive system.

This allows almost continuous monitoring of the state of the insulation of the end winding, and ensures that faults are detected promptly. It is therefore possible to prevent insulation-related failures of dynamo-electric machines, i.e. both linear and rotary dynamo-electric machines, whatever their field of use.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
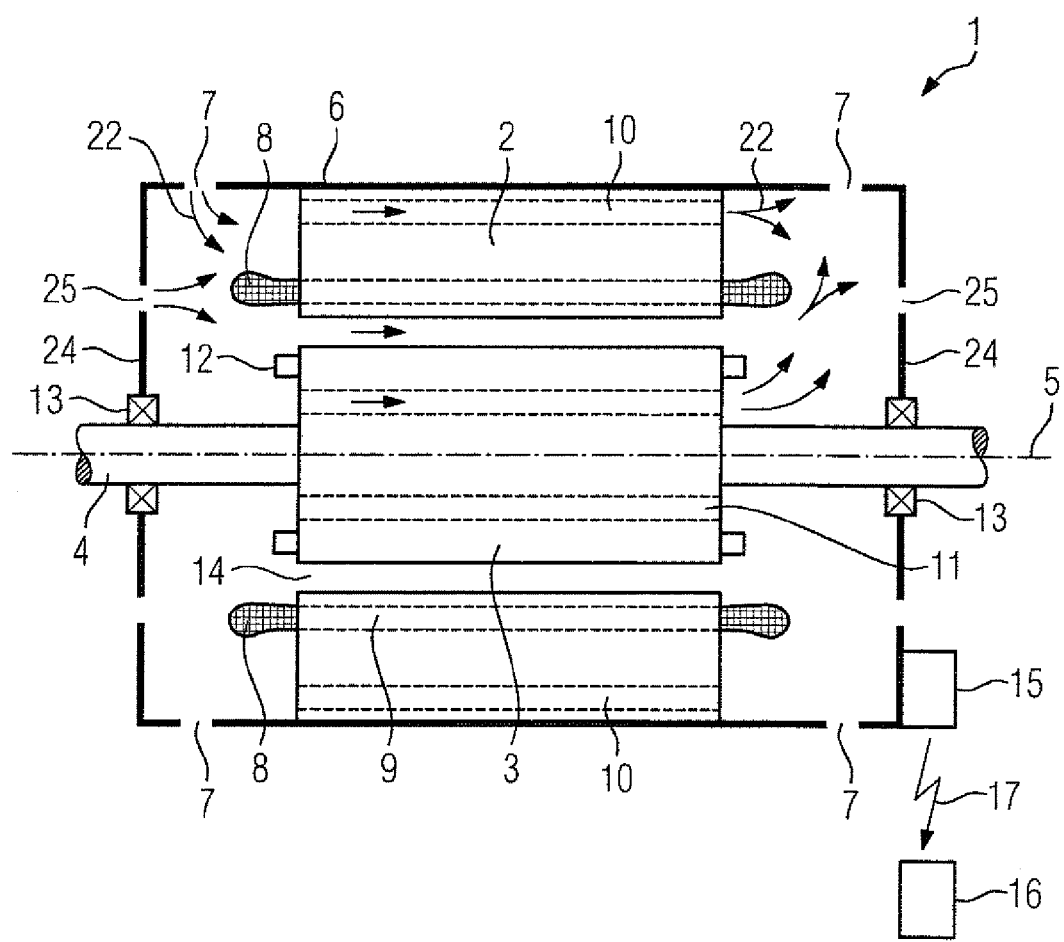
FIG. 1 shows a longitudinal section of an enclosed-ventilated dynamo-electric rotary machine.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a basic longitudinal section of a dynamo-electric rotary enclosed-ventilated machine, generally designated by reference numeral 1 and including a stator 2 and a rotor 3, with the rotor 3 being connected in fixed rotative engagement to a shaft 4 and mounted for rotation about an axis 5.

The shaft 4 is basically held by a bearing 13 on both sides of the active parts, i.e. the stator 2 and the rotor 3, the bearing 13 being positioned by an end plate 24 in each case. The end plate 24 is itself held in a housing 6, whose outer walls extend parallel with the axis in this specific case.

The stator 2 has axially layered plates, wherein the laminated core has slots 9 which run essentially axially, with the slots 9 being arranged in the region of the air gap 14 of the dynamo-electric rotary machine 1. The stator 2 has a winding system in these slots 9, which forms end windings 8 at the end faces of the laminated core of the stator 2.

During operation of the dynamo-electric rotary machine 1, rotation (in driving mode) or energy generation (in generative mode) of the dynamo-electric rotary machine 1 occurs as a result of the electromagnetic interaction of the winding system with the rotor 3.

The stator 2 has cooling channels 10 which run parallel with the axis and are uniformly distributed in a circumferential direction. The cooling channels 10 are preferably round or approximately round, but may also have other geometric cross sectional shapes such as a star, triangle, etc.

The rotor 3 is designed as a squirrel-cage rotor, wherein a squirrel-cage winding is located at the end faces of the rotor 3, facing the air gap 14, and forms rotor end rings 12 at the end faces of the rotor 3. One or more cooling channels 11 which are axially aligned and distributed in a circumferential direction are arranged between the squirrel-cage winding of the rotor 3 and the shaft 4, and may also be provided in the stator 2. The housing 6 and/or the end plate 24 have openings 7 and 25 respectively, via which an exchange of air with the environment takes place, preferably in a forced manner. These openings 7 and 25 may be covered with filter mats or the like in order to provide prefiltering of the cooling air.

The air flows are generated by one or more fans in this case. Cooling may be effected locally and/or remotely.

FIG. 1 shows, by way of example, a cooling air stream 22 which enters into the dynamo-electric rotary machine 1, continues via the axially aligned cooling channels 10, 11 and the air gap 14, and exits as heated cooling air stream the housing 6 or the rotary dynamo-electric machine 1 again via openings 7 and 25. For the sake of clarity, an exemplary course of a cooling air stream is only illustrated in the upper half of FIG. 1.

Particles are introduced into the machine 1 at the same time as the incoming cooling air stream and, with more or less intensity depending on the speed of the cooling air stream 22, strike the end winding 8 in particular. Due to the comparatively low thermal capacity of air, a sufficient volume through the machine must be ensured in order to obtain a corresponding cooling effect for the dynamo-electric machine 1.

As a result of the desired volume throughput and the associated high speed of the cooling air stream supplied from outside, the particles carried along by the cooling air also achieve comparatively high speeds and strike the end winding 8 in particular, and particularly the insulation of the end winding 8. This results in premature wear of the insulation of the end winding 8, particularly when the operating environment is correspondingly dust-laden, for example. Owing to the different phases of the winding system, which intersect and/or overlap each other in the end winding 8, this results in a failure of the dynamo-electric machine 1.

According to the invention, a monitoring element 20 is provided in the end winding 8 or directly at the end winding 8. The monitoring element 20 can be realized by at least one wire and/or at least one optical fiber, with the wire and/or optical fiber being likewise exposed to the abrasion process. As soon as the wire or the optical fiber is abraded by the particles, the ohmic resistance or the light passing through the optical fiber is changed accordingly, giving a clear indication, in the context of a check, of the continuous degradation of the insulating properties of the insulation at the end winding 8.

As an alternative, such wires or optical fibers can be applied to the end winding 8 in an additional layer 19 which is provided separately, and trigger a report of the insulation loss as a result of the physical conditions described above. The wires and/or optical fibers are arranged in one or more plies in the additional layer 19, this being attached directly at the end winding 8 on the insulation of the end winding, preferably by means of adhesion or held by a bandage.

In the case of essentially automated monitoring, a corresponding measurement signal is applied to the wire or to the optical fiber at predetermined time intervals by a control module 15, which may be situated in the converter or directly at the electric machine 1, for example. On the basis of the return signal, corresponding measurement values or reports are then stored in a memory, for example, in or at the control module 15, where they can be retrieved at any time. The measurement data can be forwarded to a control point 16, e.g. via radio 17, where it is classified and evaluated.

These reports of the insulation resistance, in particular at the end winding 8, may be transmitted to all supervisory system control units in the case of e.g. trainsets or mining trucks in order thus to provide reports, in particular for the driver and/or a control point 16, about the state of the drive system and in particular the insulation system.

This allows almost continuous monitoring of the state of the insulation of the end winding 8, and ensures that faults are detected promptly. It is therefore possible to prevent insulation-related failures of dynamo-electric machines 1, whatever their field of use.

Figure 2:
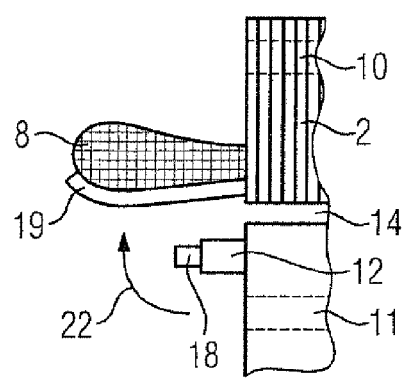
FIGS. 2 to 4 show various embodiments of a monitoring system at an end winding.

FIG. 2 shows an exemplary arrangement of such an additional layer 19 on that side of the end winding 8 which faces the air gap 14. This is particularly important when an additional fan blade 18 is to be mounted on the rotor end ring 12, resulting in a radial ducting of cooling air and hence an increased impact of the particles of the cooling air stream at the point which is marked on the end winding 8. The insulation of the end winding 8 is therefore monitored by the additional layer 19 or by wires and optical fibers embedded in the insulation material there.

Figure 3:
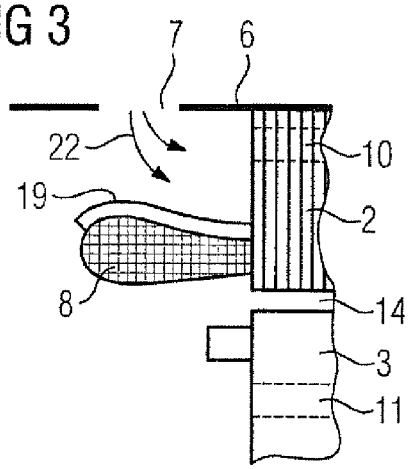

FIG. 3 shows a different entry/course of the cooling air 22 in a different ducting variant. Here again, as a result of the increased abrasion on the upper side of the end winding 8, this region of the end winding 8 is monitored at specific points or over the surface.

Figure 4:
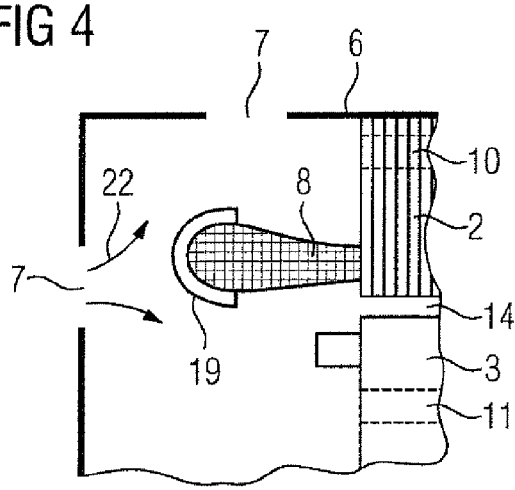

FIG. 4 shows the layer which must be protected in a further embodiment variant featuring axial flow against the end winding 8, wherein this can likewise be achieved by means of an additional layer 19 comprising wires and optical fibers, or by wires and optical fibers which are embedded in the end winding 8.

Figure 5:
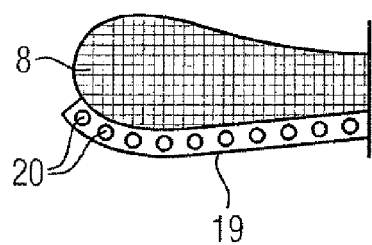
FIGS. 5 and 6 show various embodiments of wires or optical fibers in an intermediate layer.

FIG. 5 shows a detailed illustration of the structure of such an additional layer 19, which contains a plurality of individual wires 20 or optical fibers and is applied to the end winding 8, in particular as per the embodiment according to FIG. 2.

Figure 6:
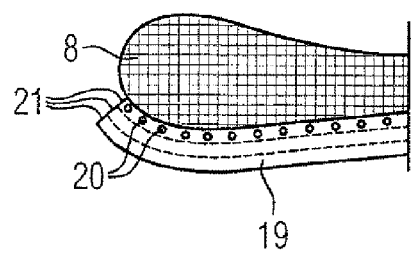

In order to obtain cascade reports which indicate the different abrasion states of the end winding 8, it is possible to configure either a plurality of individual layers of wires or optical fibers, or a plurality of successively connected plies of wires or optical fibers in an intermediate layer 21. The basic illustrations of these exemplary embodiments as per FIG. 5 and FIG. 6 can be transferred to the illustrations as per FIG. 3 and FIG. 4.

Figure 7:
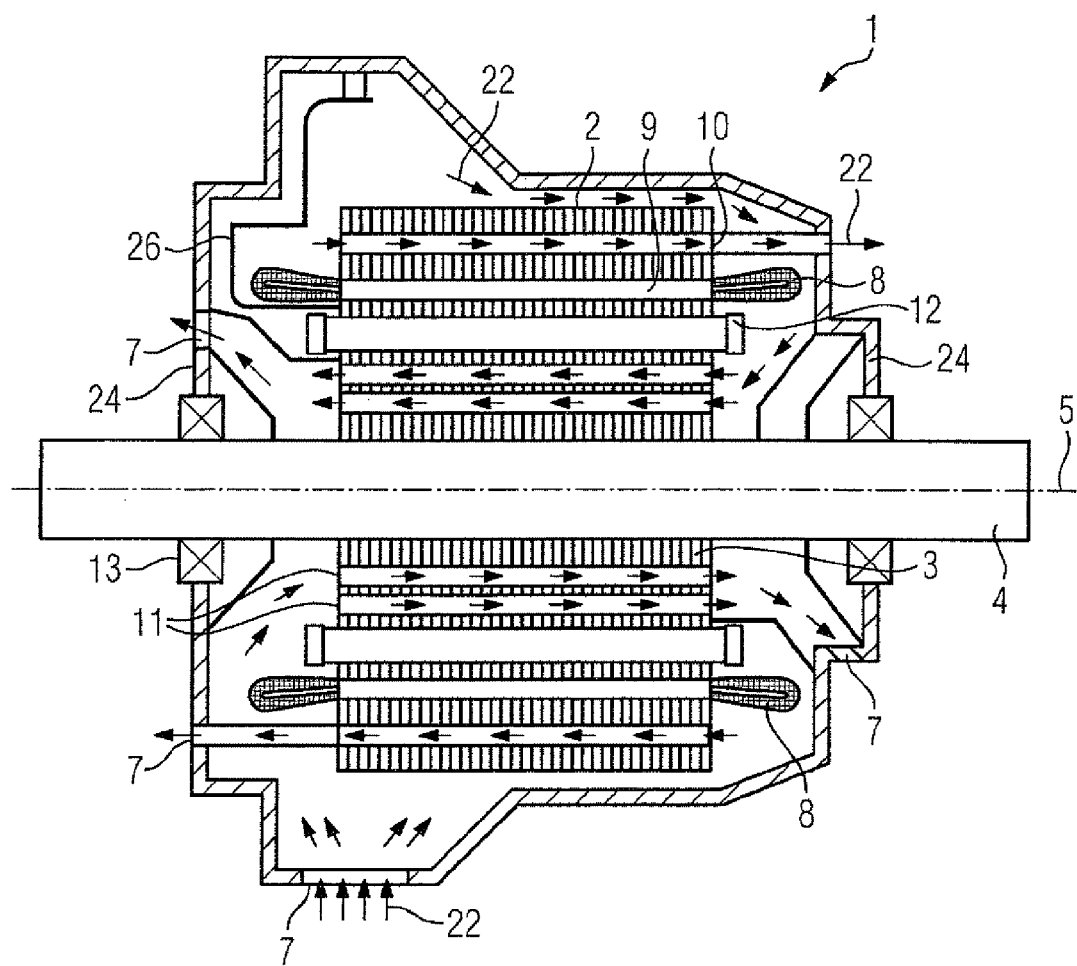
FIG. 7 shows a drive of a mining truck which has special air ducts.

The use of such an insulation monitoring element due to e.g. abrasion can also be seen in FIG. 7, which illustrates a drive for a mining truck, for example. This motor corresponds in principle to that in FIG. 1, differing only in that certain air ducting channels are specially designed and a cooling air stream 22 is optionally also ducted via a terminal box (not shown in detail) of the motor.

Figure 8:
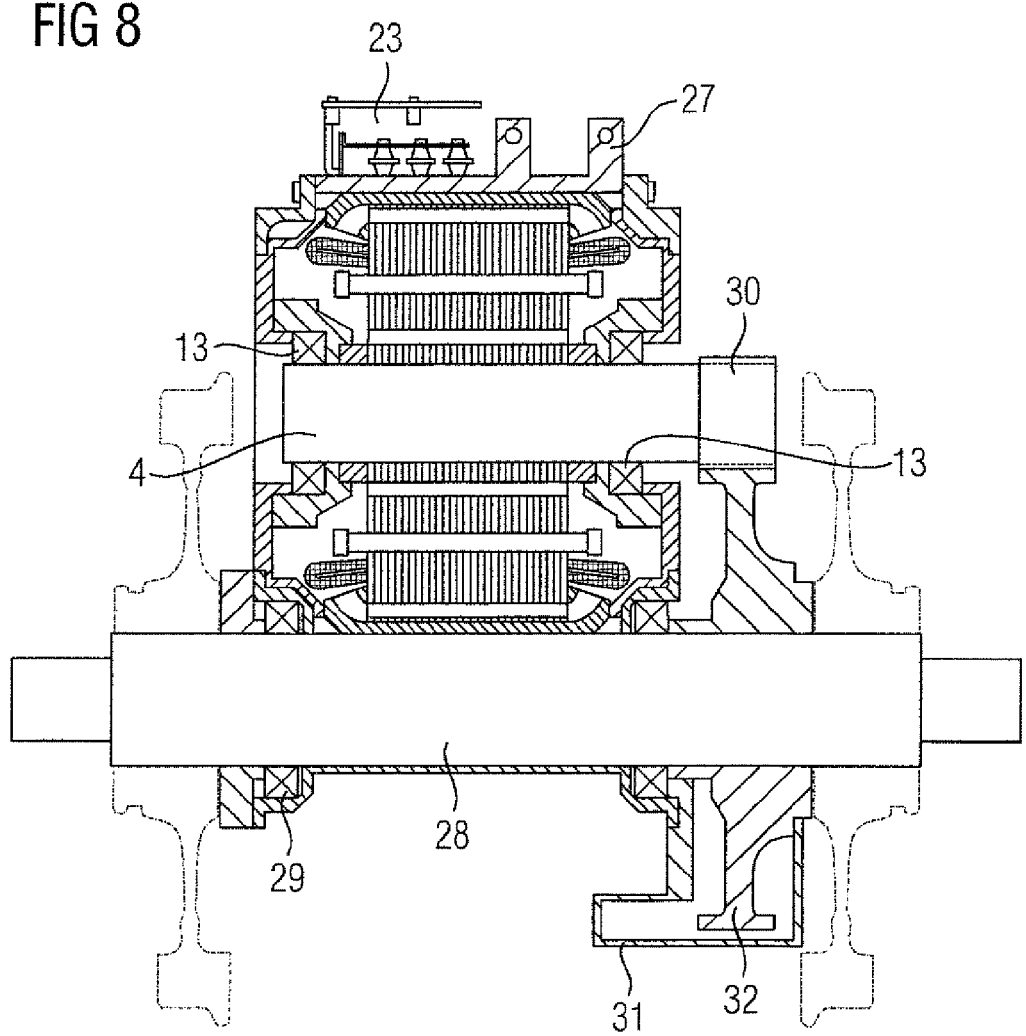
FIG. 8 shows a drive of a locomotive.

FIG. 8 shows a further field of use for such a dynamo-electric machine 1 as per FIG. 1 in the context of a drive for a locomotive, wherein the dynamo-electric machine 1 drives a pinion 30 and hence a gear 32 via the shaft 4. In this case, the drive is connected to a bogie (not shown in detail) via a torque converter bearing 27. The gear 32 is connected in a non-rotatable manner to a wheelset shaft 28, which is in turn connected in a non-rotatable manner to the wheels of a locomotive (broken marked). Both the wheelset shaft 28 and the shaft 4 are mounted separately via nose bearings 29 and bearings 13 respectively. The gear 32 runs in a transmission housing 31, which is also provided with lubricant for lubricating the gear 32.

For the sake of clarity, the locomotive drive is only illustrated in principle, and the individual streams of cooling air are not illustrated.

Figure 9:
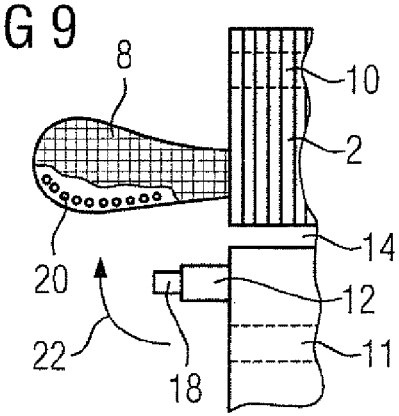
FIG. 9 shows another embodiment of a monitoring element in an end winding.

Similar to FIG. 2, FIG. 9 shows the arrangement of the wires or optical fibers embedded in the insulation of the end winding 8. The wires or optical fibers are arranged there as closely as possible to the surface of the insulation of the end winding 8, in order that the abrasion and hence the reduction in insulation can be detected promptly.

Otherwise, with regard to the monitoring of the insulation of the end winding 8, the statements relating to the embodiment variants cited above and concerning inter alia the arrangements and the measuring methodology, apply analogously. The progressive monitoring model, the monitoring of the insulation, and the application to mining trucks and railway drives as per the above explanations can likewise be implemented for the arrangement according to FIG. 9.

It is also possible in principle to combine the features of the embodiments described above.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. An air-cooled dynamo-electric machine, comprising:
   a stator including a winding system which forms end windings at end faces of the stator; and at least one monitoring element provided in an insulation layer applied to the insulation layer of at least each said end winding for monitoring an insulation thickness of the end winding, wherein the monitoring element is embedded in the insulation layer or in an intermediate layer of the end winding using a plurality of radially superimposed wires or optical fibers starting from the end winding.

2. The air-cooled dynamo-electric machine of claim 1, wherein the air-cooled dynamo-electric machine is constructed in the form of an enclosed-ventilated dynamo-electric machine.

3. The air-cooled dynamo-electric machine of claim 1, wherein the monitoring element is provided in the end winding at least at an area which is exposed to a cooling air stream.

4. The air-cooled dynamo-electric machine of claim 1, wherein the monitoring element comprises at least one wire and/or optical fiber arrangement.

5. The air-cooled dynamo-electric machine of claim 1, wherein the monitoring element is configured to detect an insulation resistance at the end winding.

6. A method for checking an insulation of an end winding of an air-cooled dynamo-electric machine, comprising:
sending signals to a monitoring element in an end winding of a winding system at an end face of a stator at predetermined time intervals;
receiving return signals from the monitoring element;
evaluating the return signals to draw a conclusion about the insulation of the end winding; and
classifying the insulation of the end winding as a function of the received return signals.

* * * * *